(12) United States Patent
Lee

(10) Patent No.: US 7,582,887 B1
(45) Date of Patent: Sep. 1, 2009

(54) OPTOCOUPLER CURRENT TRANSFER RATIO TEMPERATURE COMPENSATION METHOD AND APPARATUS

(75) Inventor: Eugene C. Lee, 630 Harrisburg Pl., San Jose, CA (US) 95133

(73) Assignee: Eugene C. Lee, San Jose, CA (US)

( * ) Notice: Subject to any disclaimer, the term of this patent is extended or adjusted under 35 U.S.C. 154(b) by 0 days.

(21) Appl. No.: 12/080,466

(22) Filed: Apr. 3, 2008

(51) Int. Cl.
*G02B 27/00* (2006.01)
(52) U.S. Cl. .................................... 250/551; 250/214.1
(58) Field of Classification Search ................ 250/551, 250/214.1; 385/15, 31; 398/82
See application file for complete search history.

(56) References Cited

U.S. PATENT DOCUMENTS

| 4,652,764 | A | | 3/1987 | Nagano |
| 5,283,441 | A | * | 2/1994 | Fabian .................... 250/551 |
| 5,747,836 | A | * | 5/1998 | Mariyama ................ 257/119 |
| 6,414,450 | B1 | * | 7/2002 | De Wulf ................... 315/291 |
| 7,250,806 | B2 | | 7/2007 | Zhang |
| 7,326,947 | B2 | | 2/2008 | Lee |
| 2007/0108397 | A1 | * | 5/2007 | Lee et al. ................. 250/551 |

* cited by examiner

*Primary Examiner*—Georgia Y Epps
*Assistant Examiner*—Kevin Wyatt

(57) ABSTRACT

Current transfer ratio temperature variation of an optocoupler is compensated by generation and summing of an optically generated current with a temperature dependent multiple of the optically generated current at the detector of the optocoupler.

1 Claim, 4 Drawing Sheets

OPTOCOUPLER CURRENT TRANSFER RATIO TEMPERATURE COMPENSATION METHOD AND APPARATUS

BACKGROUND OF THE INVENTION

1. Field of the Invention

This invention relates to an optically coupled semiconductor device known as an optocoupler. More specifically, this invention relates to the temperature compensation of the current transfer ratio of an optocoupler.

2. Description of the Related Art

Any discussion of the prior art throughout the specification should in no way be considered as an admission that such prior art is widely known or form part of common general knowledge in the field.

Optocoupler is a common semiconductor device uses in the electronic system level design for input to output safety or signal isolation. FIG. 1 shows the circuit description and pin out of an optocoupler. The input of an optocoupler consists of an infrared light emitting diode (LED) die. The output of an optocoupler is consists of a detector die which typically is a photo bipolar NPN transistor. The input and output dice are separated by an electrically insulated material which is transparent to infrared light. The input and output components and their light transmitting medium are encased in molded plastic, metal can or ceramic enclosure. When there is current flowing in the LED, it emits infrared light. The infrared light goes through the insulation material and is detected by the collector base region of the photo bipolar NPN transistor. The infrared light generates hole electron pairs in the collector base region of the transistor which resulting a photo current flowing into the base of the bipolar transistor. This photo current is multiplied by the current gain, beta, of the bipolar transistor to produce an output collector current. A current transfer ratio, CTR, of an optocoupler is defined as the ratio of the output collector current over the current flowing in the infrared LED. FIG. 2 illustrates the CTR of an optocoupler. The CTR value of an optocoupler is a key parameter for system level designer especially when the optocoupler is used in the linear operation mode as in the feedback path of a switching mode power supply design as an example. Unfortunately, the CTR of the prior art optocoupler has a very large negative temperature coefficient. The CTR temperature dependency comes from two sources. The first source is the decreases in light emission efficiency of the infrared LED. Typically, the light emission efficiency of an infrared LED has a negative temperature coefficient of about −7500 ppm. So, the LED light emission efficiency decreases to about 40-50% of the room temperature value at 100 C which means that the photo current produces at the base of the output photo transistor is reduced by the same amount. The second source is the change in the beta of the output photo transistor due to increase in emitter efficiency. The beta has a temperature coefficient of about +6000 ppm so the beta value will increase by 40% from room temperature to 100 C. Since the photo current is reduced by 50-60% but the beta only increased by 40%, the output collector current is 60-70% of the room temperature value. Thus the CTR of the optocoupler at 100 C is typically about 60-70% of the room temperature value. This large change in CTR over temperature presents a design difficulty to system level design engineer. To compensate for the large CTR temperature change of the optocoupler, system designer has to add additional components and circuit complexities to the design which increases the system product cost. A mean of such compensation is illustrated in U.S. Pat. No. 7,326,947 where the CTR of the optocoupler system is compensated by introducing an additional temperature compensating current to the LED. However, a way to compensate for the CTR temperature variation while keeping the optocoupler pin out configuration and without additional external input or output design requirement to the optocoupler would be valuable to those who use the optocoupler in their system level design and application.

BRIEF SUMMARY OF THE INVENTION

This optocoupler CTR temperature compensation apparatus of the present invention overcomes the problem associated with the prior art. The present invention offers a solution to the problem and produces a product which is pin for pin compatible to the prior art so user can directly replace the prior art device with device which contains the present invention. The large negative CTR temperature coefficient of the prior optocoupler is due to the positive change in the transistor's beta as temperature increase is smaller than the negative change in the LED's emission efficiency. In the present invention, the output current of the optocoupler coupler is the sum of two components of current. One component is the collector current of the photo bipolar transistor which is equal to beta times the photo current generated at its base. The second component of the output current is a multiple of the photo transistor's collector current and this current multiplication is designed to have a positive temperature coefficient. By properly selecting the magnitude of the positive temperature coefficient of the second current component, the output current of the optocoupler can be made insensitive to temperature changes which makes the CTR of the optocoupler insensitive to temperature changes.

DETAIL DESCRIPTION OF THE INVENTION

Figure 1:
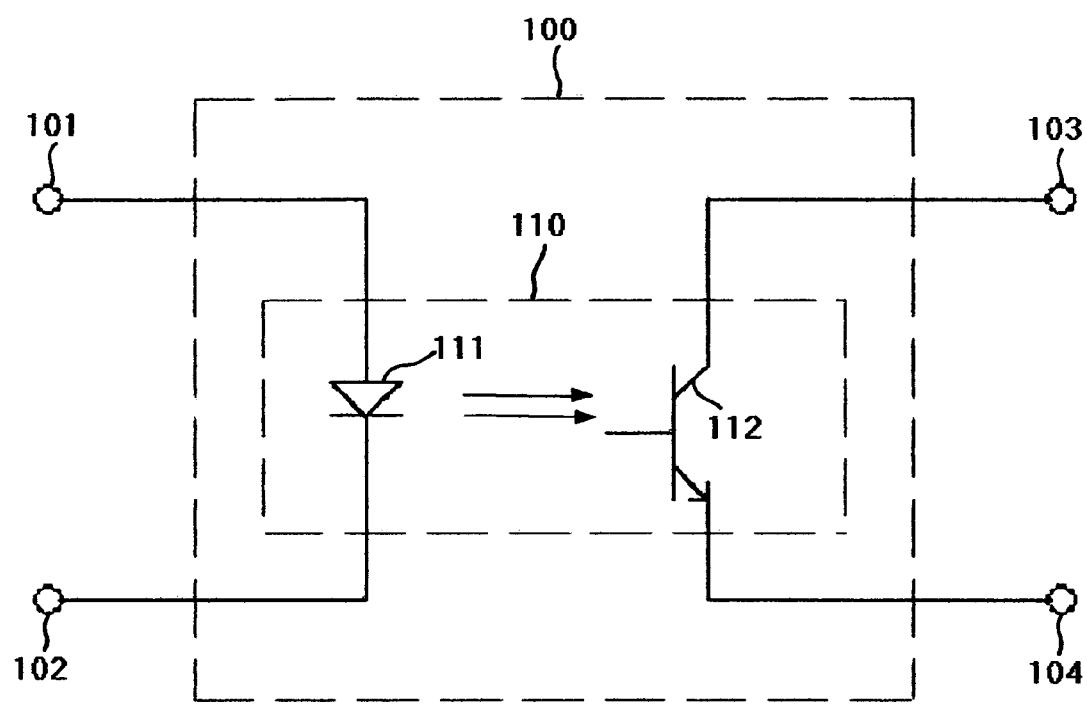
FIG. 1 is a circuit description of the prior art optocoupler.
Figure 2:
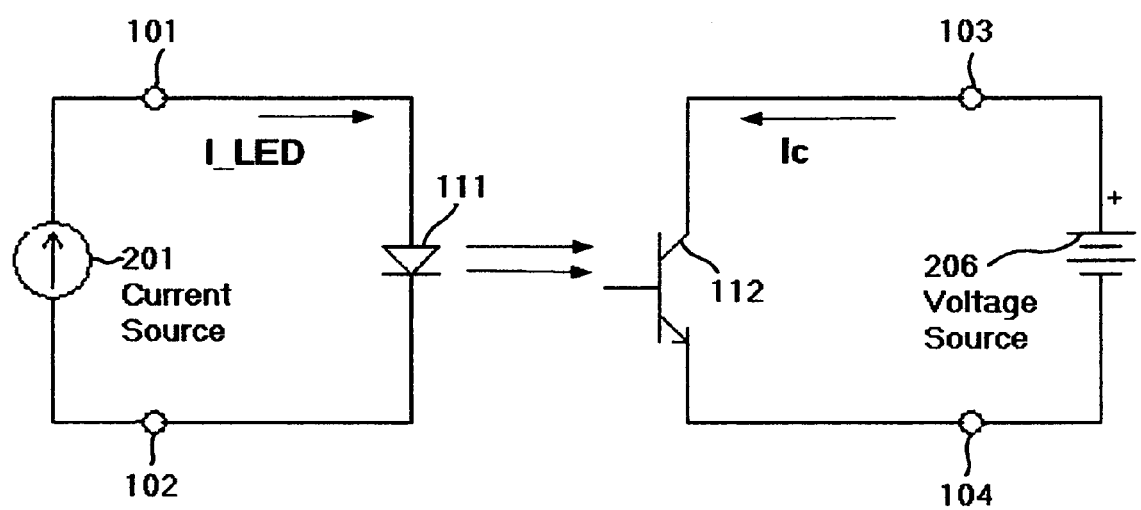
FIG. 2 is description of the CTR of an optocoupler.
Figure 3:
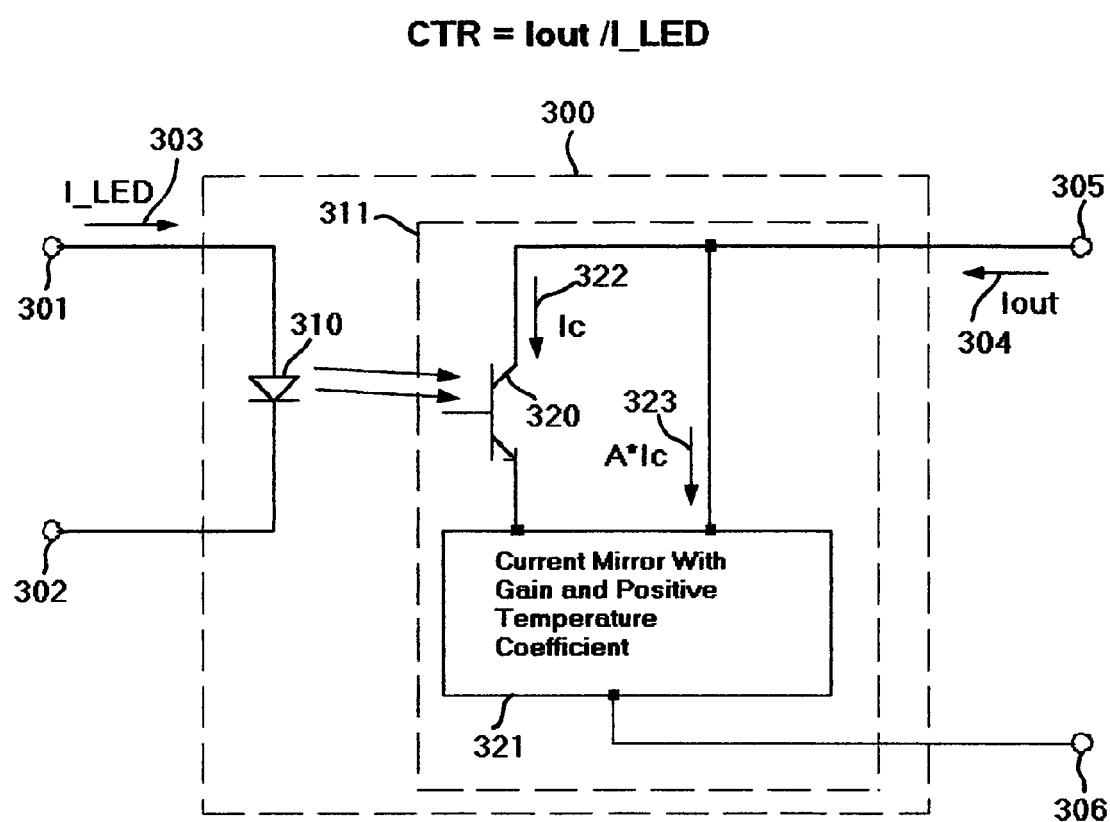
FIG. 3 is a circuit block diagram of the present invention of a temperature compensated optocoupler.

FIG. 3 shows the block diagram of an optocoupler with CTR temperature compensation. The optocoupler consists of an input LED 310 and a detector die 311. The detector die consists of a photo transistor 320 and a current mirror 321. When there is current flowing in the input LED 310, it emits infrared light to the base collector region of the photo transistor 320. The infrared light generates a photo current at the base of the photo transistor 320. The photo current is multiplied by the beta of the photo transistor 320 to generate collector current, Ic 322. Ic 322 feeds into current mirror 321. Current mirror 321 has a current gain of A at room temperature so the output of the current mirror is equal to A*Ic 323. The total output current results from a LED current 303 is equal to Ic 322+A*Ic 323. The current transfer ratio, CTR, of the optocoupler is the ratio of (Ic 322+A*Ic 323) over the LED current 303. As described in the prior art section, the prior art optocoupler in FIG. 2 has a negative CTR temperature coefficient because the positive temperature coefficient of the photo NPN 112 transistor's beta is not enough to compensate for the negative temperature coefficient of the LED 111 light emission efficiency. In the present invention, the output current is the sum of Ic 322 and A*Ic 323 as shown in FIG. 3 where A is the current gain of the current mirror 321. By designing the current mirror such that the current gain A to have a proper positive temperature coefficient, the output current can be made temperature independent which will make the CTR of the optocoupler temperature independent.

Figure 4:
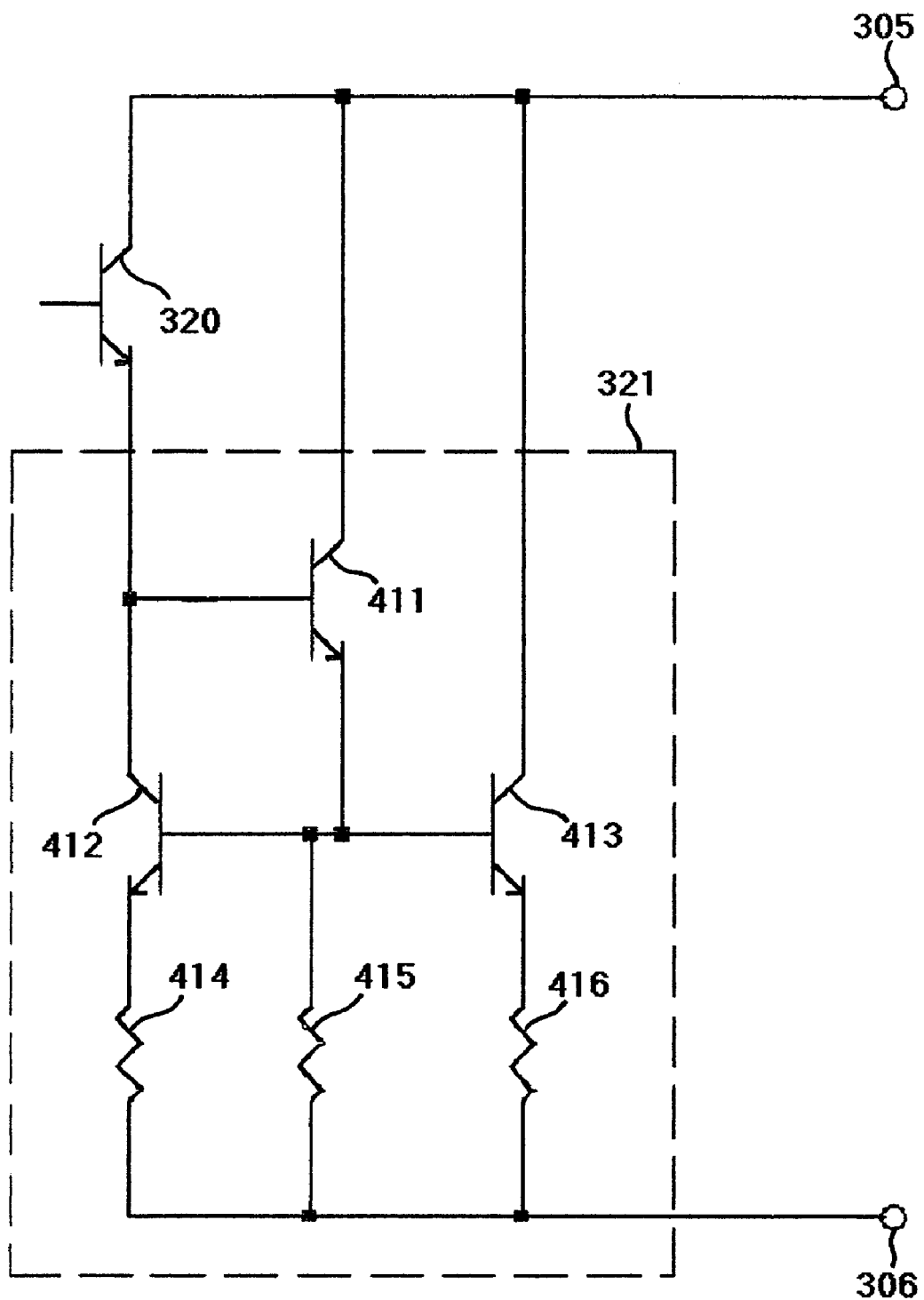
FIG. 4 is the detail circuit schematic of the detector die which consists of a photo transistor and a positive temperature coefficient current mirror with current gain.

FIG. 4 shows the detail circuit schematic of the detector die. NPN transistor 320 is the photo transistor. NPN transistors 411, 412, 413 and resistors 414, 415 and 416 form the current mirror 321 circuit. Assuming the NPN transistor's beta is large so the emitter current is equal to its collector current. Ic of transistor 320 flows down its emitter and serves as the input current to the current mirror 321. To achieve a current gain value of A in the current mirror, the value of the resistor 414 is chosen to be A times the value of resistor 416. To ensure equal emitter current density in transistor 412 and 413, the emitter area value of transistor 413 is chosen to be A times the emitter area value of transistor 412. Transistor 411 is used as a current buffer to minimize the current mirror's input to output reflection error due to the base current loading of transistor 412 and 413 to the current mirror input current. Since transistor 411 and 412 forms a local feedback loop, resistor 415 is used to force transistor 411 to conduct a minimum collector current to maintain frequency stability of the feedback loop. However, the collector current of transistor 411 is normally a few micro amperes so its contribution to the total output current of the optocoupler is considered negligible here.

In a semiconductor fabrication technology, different types of resistor are made with different diffusion, implantation or deposition layer. Also, different type of resistor has different temperature coefficient. As described above, the current gain of the current mirror is set by the resistor ratio of resistor 414 and resistor 416. To achieve a current mirror gain with positive temperature coefficient, use a type of resistor with high positive temperature coefficient to make resistor 414 and use a type of resistor with low positive temperature coefficient or negative temperature coefficient to make resistor 416. So, as the temperature increases, resistor 414 value increases at a higher rate than the resistor 416 value. Thus the resistor 414 to resistor 416 ratio increases with temperature producing a higher current mirror gain. For example, resistor 414 can be made using n-well which has a temperature coefficient of +5000 ppm/degree and resistor 416 can be made with implant resistor which has a temperature coefficient of +100 ppm/degree. By properly choosing the type of resistor to make resistor 414 and 416, the positive temperature coefficient of the current mirror and the gain of the current mirror work to enhance the net effect of the positive temperature coefficient of the NPN photo transistor beta to cancel out the negative temperature coefficient effect of the LED.

The advantage of this CTR temperature compensation method is that it is transparent to the user of the optocoupler. Since the CTR temperature compensated optocoupler has the same input and output pin out configuration as the prior art product, the temperature compensated optocoupler can be used to directly replacement of the prior art product. Due to the use of gain in the current mirror, the photo transistor size can be made smaller by the factor equal to the current mirror gain to achieve the same output current as the prior art product so the detector die size increase with the CTR temperature compensation is minimized.

What is claimed is:

1. A method to compensate a current transfer ratio temperature variation of an optocoupler, comprising: (a) generating and summing of an optically generated current from a photo bipolar NPN transistor with a temperature dependent multiple of said optically generated current to produce a temperature compensated output current of the optocoupler; (b) said multiple of said optically generated current is realized with a common base current mirror circuit with emitter degeneration resistors integrated on a detector die of said optocoupler to produce the output current of said optocoupler; (c) said temperature compensation of said output current of said optocoupler is realized by a difference in temperature coefficients associated with different types of said emitter degeneration resistors integrated on said detector die of said optocoupler.

* * * * *